United States Patent [19]

Solie et al.

[11] Patent Number: 5,519,365

[45] Date of Patent: May 21, 1996

[54] WAVEGUIDE FOR AN ACOUSTIC CHARGE TRANSPORT DEVICE

[75] Inventors: Leland P. Solie; Michael J. Hoskins, both of Mahomet; Theodore W. Hampton, Champaign, all of Ill.

[73] Assignee: Electronic Decisions Inc., Urbana, Ill.

[21] Appl. No.: 676,969

[22] Filed: Mar. 29, 1991

[51] Int. Cl.$^6$ ............................... H03H 9/00; H01L 41/04
[52] U.S. Cl. ........................................ 333/153; 310/313 R
[58] Field of Search ....................................... 333/150–154, 333/165; 310/313 R, 313 B, 313 C, 313 D; 357/24

[56] References Cited

U.S. PATENT DOCUMENTS

| | | | |
|---|---|---|---|
| 3,626,334 | 12/1971 | Kayes | 333/152 |
| 3,906,432 | 9/1973 | Ash | 333/150 X |
| 4,217,564 | 8/1980 | Autron | 333/152 |
| 4,330,768 | 5/1982 | Huang et al. | 364/821 X |
| 4,401,956 | 8/1983 | Joshi | 333/152 |
| 4,893,161 | 1/1990 | Tanski et al. | 357/24 M |
| 4,994,772 | 2/1991 | Ballato | 333/152 |

OTHER PUBLICATIONS

Wilkus, "Transverse Mode Compensation of Surface Acoustic Wave Filters" IEEE 1985 Ultrasonics Symposium Proceedings, San Francisco, CA; Oct. 1985.

Schmidt et al. "Thin Film Acoustic Surface Waveguide on Anisotropic Media" IEEE Transactions on Sonic & Ultrasonics, Mar. 1975.

Primary Examiner—Gregory C. Issing

[57] ABSTRACT

A waveguide for surface acoustic waves comprises a substrate for supporting propagation of surface acoustic waves along a direction at a substrate velocity and a dielectric structure disposed above the substrate along the propagation direction of the surface acoustic waves. The structure includes a central portion disposed along the propagation direction, first and second intermediate portions respectively disposed along each opposed side of the central portion along the propagation direction, and first and second outer portions respectively disposed along each outer side of the first and second intermediate portions along the propagation direction. The central, intermediate and outer portions each has first, second and third intrinsic surface acoustic wave propagation velocities along the propagation direction of the surface acoustic waves, respectively and the first velocity is intermediate of the second and third velocities.

31 Claims, 5 Drawing Sheets

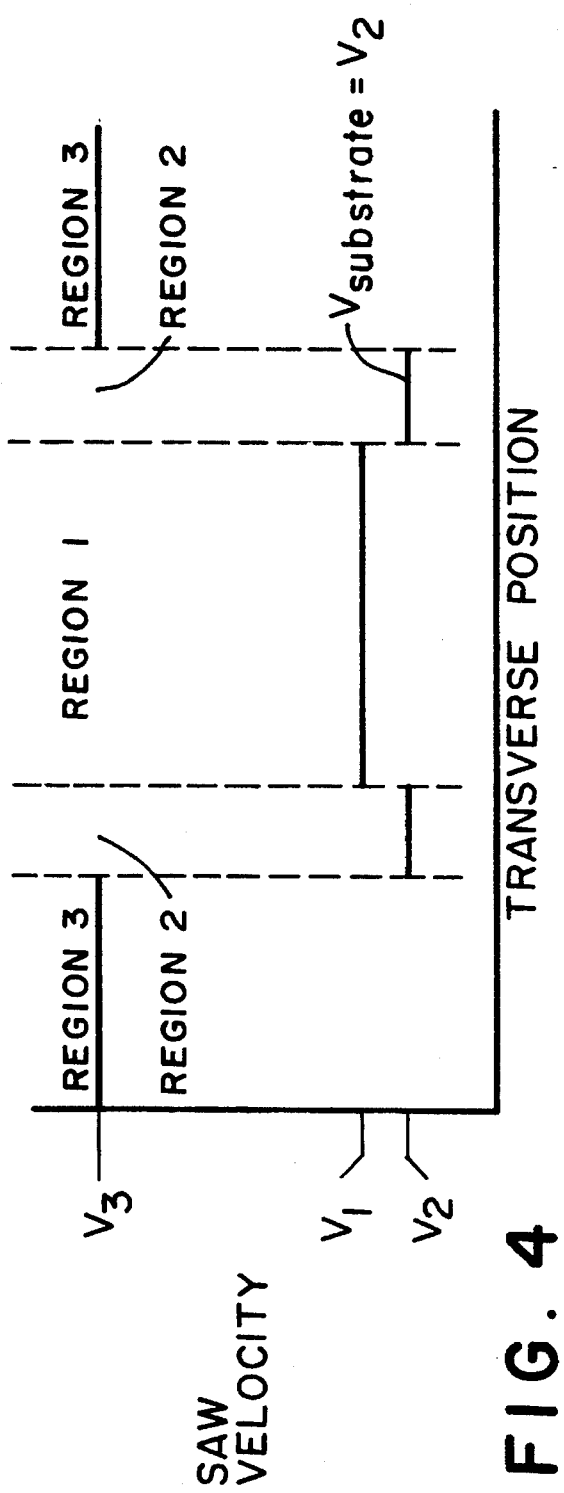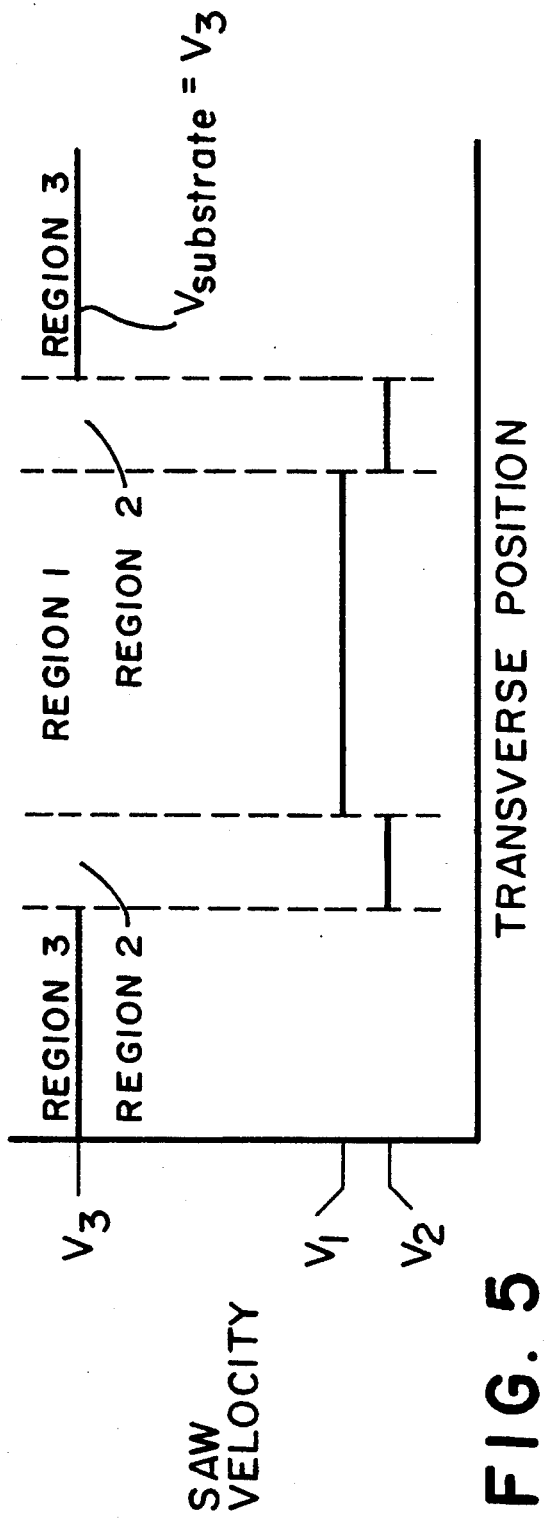

WAVEGUIDE FOR AN ACOUSTIC CHARGE TRANSPORT DEVICE

FIELD OF THE INVENTION

This invention was made with Government support under contract number DASG60-88-C-0022 awarded by the Department of Defense. The Government has certain rights in this invention.

The present invention generally pertains to a waveguide for surface acoustic waves, and particularly to a three-velocity waveguide for use in an acoustic charge transport device.

The present invention is related to copending application entitled "Acoustic Charge Transport Integrated Circuit Process," filed on Mar. 29, 1991, Ser. No. 07/676,967 whose disclosure is hereby incorporated.

BACKGROUND OF THE INVENTION

The acoustic charge transport device (ACT) is a high speed gallium arsenide (GaAs) charge transfer device in which electron packets are transported in the traveling wave potential wells of a single frequency surface acoustic wave (SAW) generated in the GaAs. The ACT device has been disclosed previously in U.S. Pat. No. 4,633,285 and other published documents.

An important problem in acoustic charge transport device technology is the realization of surface acoustic wave propagation with narrow, well controlled beam widths over long distances. The SAW propagation characteristics are particularly stringent in multiple channel ACT device architectures involving a large number of independent parallel channels with small channel width and channel to channel spacing. In dense multichannel configurations such as these, the placement of integrated circuit elements between ACT channels is often required. However, these elements typically interfere with proper SAW propagation or lack sufficient mechanical strength to withstand the high SAW acoustic stresses; hence, the illumination of several parallel ACT channels with one wide SAW beam is not always possible. In these cases, waveguides must be used to confine individual SAW beams to each channel. The waveguides are often required to provide a very sharp beam amplitude lateral decay characteristic in order to confine the SAW beam to a narrow channel in close proximity to non-SAW compatible integrated circuit elements. The lateral decay characteristic can be quantified in terms of a transition width which we typically define as the minimum distance required for the beam amplitude to decay to 5% of its peak value.

SAW waveguides have been used previously in various SAW devices requiring beam confinement. Schmidt and Coldren ("Thin Film Acoustic Surface Waveguides on Anisotropic Media," IEEE Transactions, vol. SU-22, pp 115– 122), as well as others, have disclosed two velocity SAW waveguides which utilize the electrical or mechanical velocity loading of surface films on a piezoelectric substrate to create two distinct regions of differing SAW velocity. These guides typically use an inner region of low velocity surrounded by an outer region of high velocity to produce a first order guided mode with a beam amplitude profile which varies sinusoidally across the low velocity region and decays exponentially into the high velocity regions.

A primary difficulty with the application of the two velocity waveguide for controlling the SAW propagation in the ACT device is that the sinusoidal amplitude nonuniformity significantly limits the available SAW potential for charge transport. Moreover the mode shape characteristics of this two velocity guide establish a direct relationship between the amplitude profile uniformity and the transition width. Hence, waveguides designed for very small transition width via a rapidly varying amplitude profile produce a very narrow useable SAW beam. Efforts to restrict the ACT electronic channel width to the central portion of the mode provide better amplitude uniformity at the expense of gross SAW power inefficiency due to the small channel width to beam width ratio. These fundamental tradeoffs effectively inhibit the use of the conventional two velocity SAW waveguide in ACT devices requiring good SAW power efficiency.

Wilkus et al. ("Transverse Mode Compensation of Surface Acoustic Wave Filters," 1985 Ultrasonics Symposium Proceedings, pp.43–47) have observed that the velocity loading effects associated with the metallization structure of an interdigital SAW transducer can create a parasitic waveguide defined by three separate velocity regions. In their work, the potential modes supported by this three velocity waveguiding effect were investigated and SAW transducer design compensation techniques were devised to correct transducer tap weight errors in SAW transversal filters created by the non-uniform SAW beam profile resulting from the parasitic waveguiding.

The control of the transverse SAW beam profile is critical for the proper performance of an ACT device because the charge transport capacity of the device tends to be limited by the smallest local SAW amplitude occurring at any point across the ACT channel width. Since any portions of the SAW beam which exceed the minimum amplitude contain wasted power, a uniform amplitude beam profile provides optimal SAW power efficiency.

The present invention discloses a three velocity waveguide (3VWG) defined by a dielectric film structure which provides a uniform amplitude SAW beam shape normally obtained with unguided propagation while retaining the benefits of a compact guided mode. These properties are obtained through a structure which supports propagation of a waveguide mode with decoupled beam amplitude uniformity and transition width characteristics.

OBJECTS AND SUMMARY OF THE INVENTION

It is an object of the present invention to provide a SAW waveguide which supports the guided propagation of SAW with very uniform amplitude and essentially arbitrary beamwidth. The SAW beam energy confinement and amplitude uniformity produced with this waveguide permit the construction of power efficient high performance ACT devices with very narrow charge transport channels. These characteristics also provide excellent SAW power efficiency in ACT devices with wider channels. In addition, the transition width of the guided mode amplitude profile in this structure can be very small, permitting the construction of non-SAW compatible integrated circuit elements in close proximity to the ACT channel.

It is another object of the present invention to provide a SAW waveguide with primary application for controlling the SAW propagation in ACT devices. The waveguide supports the generation and propagation of SAW with very uniform amplitude profile and small transition width while retaining compatibility with a wide range of beam widths.

It is still another object of the present invention to provide a waveguide for SAW beam energy confinement and amplitude uniformity to permit the construction of power efficient high performance ACT devices with very narrow charge transport channels. These characteristics also provide excellent SAW power efficiency in ACT devices with wider channels. In addition, the transition width of the guided mode amplitude profile in this structure can be very small, permitting the construction of non-SAW compatible integrated circuit elements in close proximity to the ACT channel.

It is an object of the present invention to provide a SAW waveguide defined by dielectric films on a piezoelectric substrate consisting of a central region of intermediate intrinsic SAW velocity bounded by two finite width regions of low intrinsic SAW velocity which are surrounded by two outer regions of high intrinsic SAW velocity. The waveguide is constructed such that the intrinsic velocity of the central region is equal to the lowest order mode velocity of the two velocity waveguide which would result if the central region width tended to zero.

It is also an object of the present invention to provide a waveguide that provides for the propagation of a guided SAW mode which has plane wave characteristics (amplitude relatively constant over a large portion of the beam width). Typically the uniform amplitude plane wave characteristic can only be obtained with unguided (free) propagation in very wide beams where diffraction effects are minimal.

It is still an object of the present invention to provide a high performance SAW waveguide with primary application to the stringent requirements of ACT devices. The unique aspects of the waveguide construction are the use of three separate velocity regions defined by a dielectric layered structure.

The waveguide consists of a central region of intermediate intrinsic SAW velocity bounded by two finite width regions of low intrinsic SAW velocity which are surrounded by two outer regions of high intrinsic SAW velocity. According to the method of the invention, a SAW guided mode with uniform amplitude across the entire central region is achieved in this three velocity structure by constructing the waveguide such that the intrinsic velocity of the central region is equal to the lowest order mode velocity of the two velocity waveguide which would occur if the central region were non-existent.

A preferred embodiment of the waveguide utilizes a silicon nitride dielectric structure on a GaAs substrate to produce the differing intrinsic SAW velocity regions of the waveguide. This embodiment is resistant to the high strain fields associated with the SAW in an ACT device and exhibits low propagation loss. The dielectric waveguide structure is electrically compatible with the surface feature topology of the ACT device and related integrated circuits, and is process compatible with the ACT integrated circuit fabrication process.

These and other objects of the present invention will become apparent from the following detailed description.

BRIEF DESCRIPTIONS OF THE DRAWINGS

FIG. 4 is a velocity profile for the waveguide in FIG. 1, showing that the lowest velocity region in the waveguide is established by the substrate.

FIG. 5 is a velocity profile for the waveguide in FIG. 2, showing that the highest velocity region in the waveguide is established by the substrate.

DETAILED DESCRIPTION OF THE INVENTION

Figure 1:
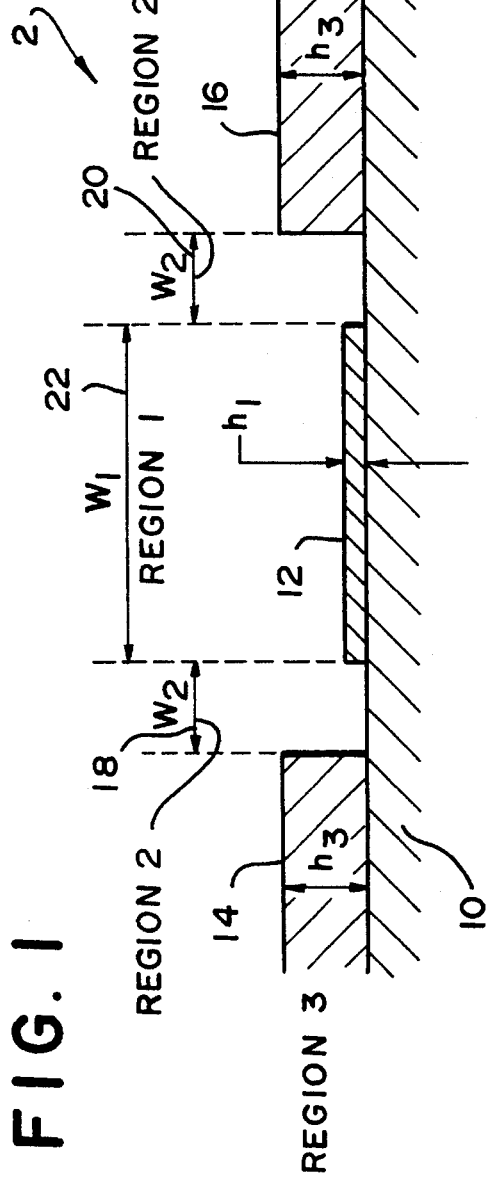
FIG. 1 is a schematic cross-sectional view of a waveguide defined by surface films which increase the velocity of a surface acoustic wave (SAW) velocity relative to that obtained in a support substrate alone.

The exact topology of the SAW waveguide depends on whether the surface film used to define the waveguide structure increases or decreases the SAW velocity relative to that obtained in the support substrate alone. A waveguide 2 defined by surface films which increase the SAW velocity is referred to as a fast film structure, as best shown in FIG. 1, which is a cross-sectional view taken across the propagation path of the SAW. There are three distinct regions to this structure. A central region 1, indicated 22, is defined by a dielectric (insulating) film 12 of width $W_1$ and thickness $h_1$. On each side of the region 1 are the two parts of region 2, indicated at 18 and 20, which are bounded by the region 1 and the edges of films 14 and 16. The portion of the waveguide outside of the regions 1 and 2 is referred to as region 3, indicated at 14 and 16 with thickness $h_3$. The films 12, 14, and 16 are fabricated on substrate 10.

Figure 2:
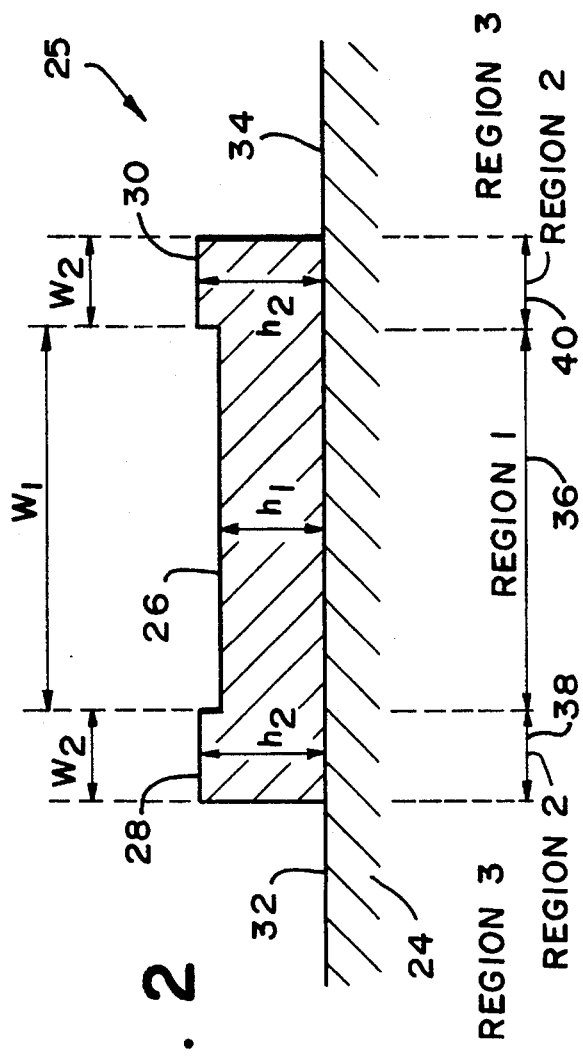
FIG. 2 is a schematic cross-sectional view of a waveguide defined by surface films which decrease the SAW velocity relative to that obtained in the support substrate alone.

A waveguide 25 defined by surface films which decrease the SAW velocity relative to that obtained in the support substrate alone is referred to as the slow film structure and a cross sectional view is shown in FIG. 2, taken across the propagation path of the SAW. There are also three distinct regions 1, 2 and 3 to this structure, as in FIG. 1. The central region 1, indicated at 36 is defined by the dielectric film 26 of width $W_1$ and thickness $h_1$. On each side of the region 1 are the two parts of the region 2, indicated at 38 and 40, which are defined by the films 28 and 30 each of which have a width $W_2$ and thickness $h_2$. The two portions of the region 3, indicated at 32 and 34, in this structure are defined by the absence of a surface film on substrate 24.

Although the regions 3 in FIGS. 1 and 2 are shown as being defined by semi-infinite thin film slabs, the portion of these regions relevant to the operation of the waveguide are practically determined by the effective penetration depth of the guided mode into these regions. Since the amplitude of the SAW guided mode decays exponentially in the regions 3, the penetration depth is typically defined by the point at which the guided mode amplitude has decayed to a small fraction (for example 1%) of its maximum value. Although this penetration depth depends on the specific waveguide parameters, typical values are of the order of a few SAW wavelengths. For the purposes of discussion the penetration depth of the guided mode into the regions 3 is referred to as the effective region 3 width.

A self-aligned masking process has been devised for the fast film structure waveguide 2 that makes the critical dimensions easy to control. This makes the process both manufacturable and reproducible. The self-alignment process is disclosed in FIGS. 3a and 3b. Only the fabrication steps directly associated with the waveguide 2 are shown. Metal electrodes may be fabricated under or over the waveguide dielectric layers provided they do not perturb the transverse velocity profile of the guide. In general, SAW compatible structures not associated with the waveguides 2 and 25 will not perturb the transverse velocity profile if they are uniformly distributed across the regions 1, 2 and the effective width of the regions 3. The successful implementation of this self-aligned process requires that the top surface layer 42 of FIG. 3a is an effective etch stop to the dielectric waveguide etch.

Figure 3A:
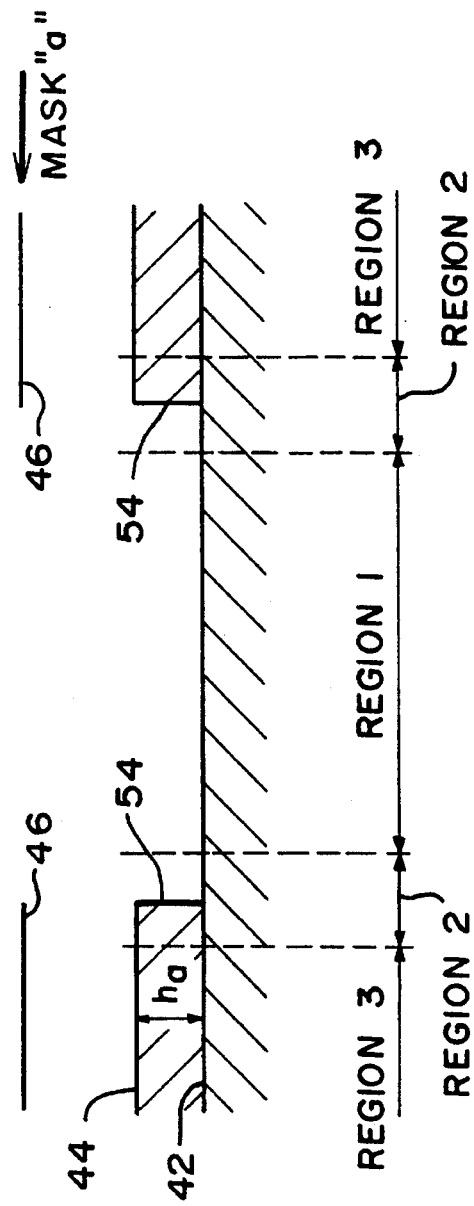
FIGS. 3a and 3b show a self alignment process for constructing the surface films of the waveguide in FIG. 1.

Referring to FIG. 3a, waveguide construction begins by depositing a uniform layer 44 of dielectric of thickness $h_a$ over the surface layer 42. Etch mask "a", indicated at 46, is used to define the etch removal of this dielectric 44 from the region 1 and about half of the region 2, as shown by the resulting structure edges 54. The alignment or etch accuracy of this step is not very critical as the edges must only lie within the region 2.

Figure 3B:
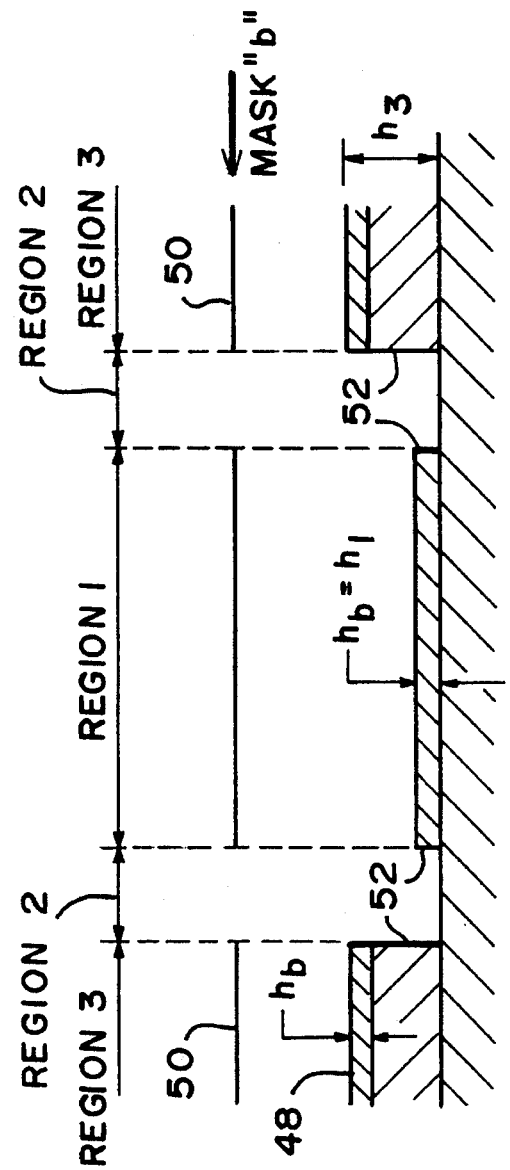

Referring to FIG. 3b, a second layer of dielectric 48 with thickness $h_b$ is deposited uniformly over the entire structure Etch mask "b" indicated at 50, is then used to remove all of the dielectric in the region 2 as shown by the resulting structure edges 52.

A key advantage of this self-aligned process is that the four boundaries 52 associated with the waveguide structure are all defined by the mask "b" and the processing does not require a precise alignment between the masks "a" and "b". Since the precise etch boundary 54 of the mask "a" is removed by the etch defined by the mask "b," the mask "a" alignment is not critical. In the resulting structure, the waveguide parameter $h_3$ is defined by the sum of $h_a$ and $h_b$, while the waveguide parameter $h_1$ is simply defined by $h_b$, thus both $h_1$ and $h_3$ can be independently established. As stated earlier, this self-alignment process is only applicable to the construction of the fast film structure waveguide 2.

The fast film structure waveguide 2 utilizes the patterned dielectric film, as described above, to create a transverse velocity profile with three different intrinsic velocities $V_1$, $V_2$, and $V_3$ corresponding to the three regions 1, 2, and 3, respectively. This velocity profile is shown in FIG. 4, where it can be seen that the lowest velocity $V_2$ region $V_{substrate}$ region in the waveguide is established by the substrate 10. The required material property of the film in this structure is that it have a SAW velocity which is faster than the SAW velocity of the substrate 10, which is $V_2$ or $V_{substrate}$. In an ACT device, the substrate 10 of FIG. 1 is typically GaAs.

The slow film structure waveguide 25 also utilizes a patterned dielectric film to create a transverse velocity profile with three different velocities $V_1$, $V_2$, and $V_3$ corresponding to the three regions 1, 2, and 3, respectively. This velocity profile is shown in FIG. 5, where it can be seen that the highest velocity $V_3$ or $V_{substrate}$ region in this structure is established by the substrate 24. The required material property of this film is that it have a SAW velocity which is slower than the SAW velocity $V_{substrate}$ of the substrate 24.

In the context of this discussion, the term velocity refers to SAW velocities in the propagation direction of the waveguide, not to the bulk wave velocities or, in the case of anisotropic material, velocities in other directions or orientations of the substrate. In general, the SAW velocity of a composite layered structure consisting of uniform substrate and surface film can be varied between the intrinsic SAW velocity of the substrate and the intrinsic SAW velocity of the material comprising the surface film. Although the variation of the velocity shift is not always monotonic with increasing film thickness at very large film thicknesses, the velocity shift tends to be proportional to the film thickness for relatively thin films with a thickness which is a small fraction of the acoustic wavelength. Hence, the precise velocities desired for the regions of the waveguide can be established with surface films of appropriate thickness.

Figure 6:
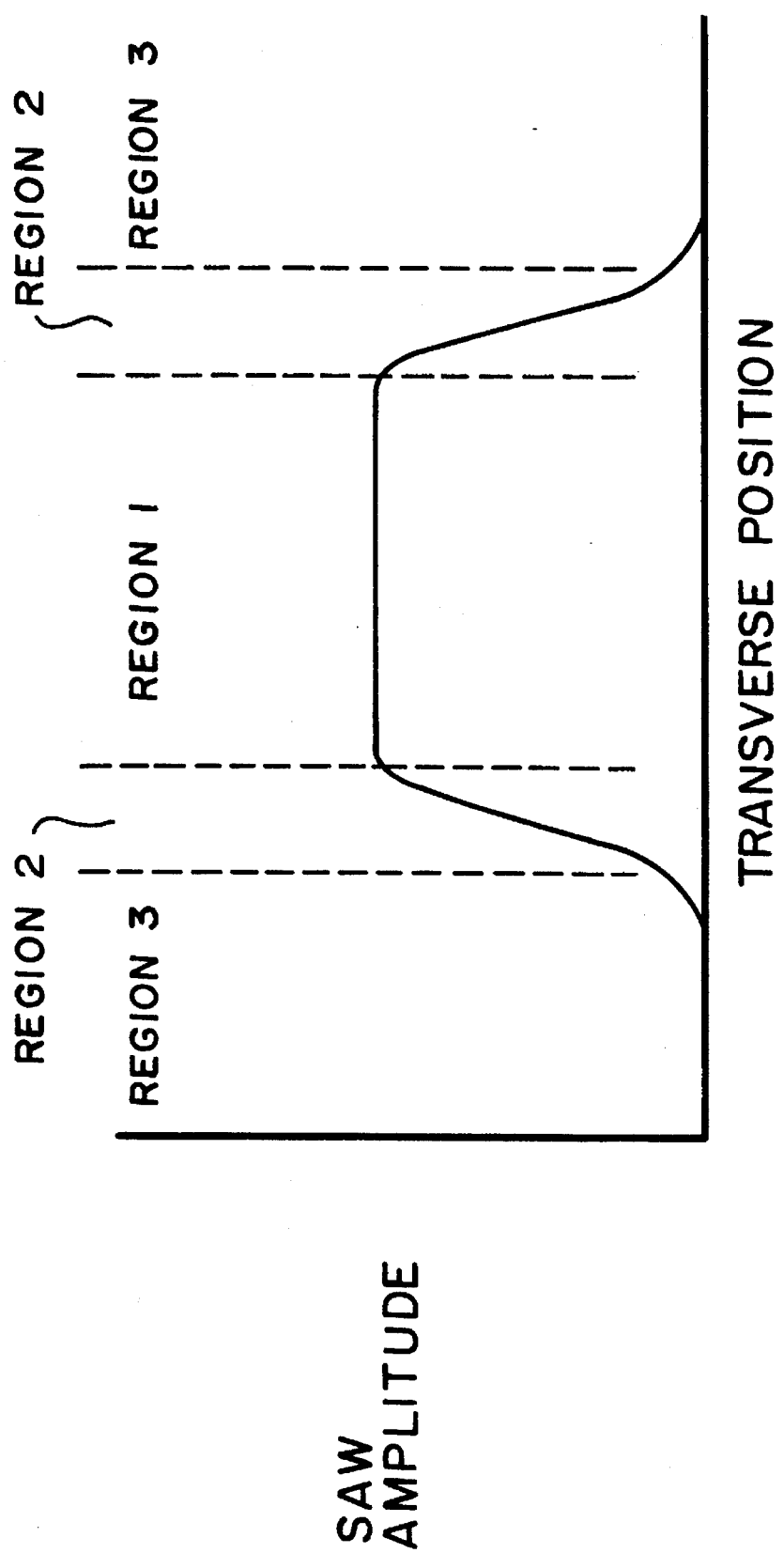
FIG. 6 is a SAW amplitude profile of the lowest order waveguide mode for both of the waveguides in FIGS. 1 and 2.

When the waveguide is constructed with the appropriate parameters according to the method of this invention, the SAW amplitude profile of the lowest order waveguide mode for both the fast film and slow film structures is identical and shown in FIG. 6. The transverse amplitude profile of the waveguides 2 and 25 has a flat or constant magnitude in the region 1, a sinusoidal transition in the region 2 and an exponential decay in the region 3. A condition for this solution to exist is shown in FIGS. 4 and 5 and given by $V_3>V_1>V_2$. This is not a sufficient condition because the mathematical solution for the functional dependence of the lowest order waveguide mode in the region 1 is, in general, a sum of complex exponentials, and the resulting function depends on the precise value of $V_1$. If $V_1=V_2$ the structure reduces to a two velocity waveguide. In this case, the amplitude profile will always have a maximum value at the center of the waveguide, i.e., the profile has a negative curvature. If $V_1=V_3$ the amplitude will always have a minimum value at the center, i.e., the profile has a positive curvature. An intermediate solution therefore exists for which the profile curvature is zero at the center of the guide. This solution results in an amplitude profile for the lowest order waveguide mode which is flat over the entire region 1.

The manner in which this unique solution can be found can be understood as follows. Consider a waveguide structure as shown in FIG. 1 in which the width $W_1$ is reduced to zero. This leaves a standard two velocity waveguide whose properties are well known. In particular, the lowest order mode has an amplitude profile which is a cosine function. It has a maximum value at the center of the guide and is symmetric about that point. The guided SAW has a mode velocity V mode which is between $V_3$ and $V_2$, i.e., $V_3>V_{mode}>V_2$. This is well known from the prior art. Now consider the structure in FIG. 1 in which $W_1$ is not zero, and choose the velocity of $V_1$ to be equal to $V_{mode}$ by the appropriate choice of $h_1$. Then the 3 velocity waveguide (3VWG) will support a guided wave with the same velocity, $V_{mode}=V_1$ and the amplitude profile in the region 1 will be absolutely flat regardless of the width $W_1$. This remarkable result is obtained because a plane wave functional form can be "inserted" at the center of the analogous two velocity guide which simulates the value of the two velocity guide function and its first derivative at the insertion point. The velocity and transition width of this three velocity guided wave depends only upon the properties of the analogous two velocity structure, i.e., $V_{mode}$ depends upon $h_3$ and $W_2$ and is independent of $W_1$. This makes the structure useful for ACT channels of all widths, wide or narrow, because the waveguide design parameters do not depend upon the beam width $W_1$.

The novel waveguide design just described exhibits a lowest order mode which could effectively be described as a "guided plane wave". This unique property of the three velocity waveguide is obtained by constructing the guide with a region 1 intrinsic velocity which is equal to the mode velocity of the analogous two velocity waveguide resulting from the absence of region 1. Under this condition, the transverse decay characteristic of the lowest order waveguide mode in regions 2 and 3 is only dependent on the velocity ratio $V_3/V_2$ and the region 2 width $W_2$; hence, nearly arbitrary transition width can be achieved by appropriate choices for these parameters. In general, smaller transition widths are obtained by increasing the ratio $V_3/V_2$ or reducing $W_2$.

In principle, a variety of dielectric materials can be used for the surface films of the waveguide since the fast and slow film approaches provide flexibility with respect to the velocity characteristic. In general, it is desirable that the material provide low SAW propagation loss. However, the application of this waveguide for controlling the propagation of the high intensity SAW in the ACT device creates additional requirements on the properties of the dielectric. These include sufficient mechanical strength to sustain high SAW power levels without suffering structural damage, electrical compatibility with the ACT device and related integrated circuits, and compatibility with the ACT integrated circuit fabrication process. We have found that a silicon nitride ($Si_3N_4$) dielectric created by the plasma enhanced chemical vapor deposition (PECVD) technique meets these stringent requirements. Since the intrinsic SAW velocity of this material exceeds the SAW velocity of GaAs, the fast film structure is required to construct the three velocity waveguide in this preferred embodiment for use with the GaAs ACT device. We have found that the dielectric film deposition technique can significantly impact the acoustic properties of the film. For example, the SAW propagation loss of silicon nitride films created by a conventional sputtering technique was found to be excessively high for the ACT application. Other materials with properties expected to be similar to those of the silicon nitride, and which are appropriate for the fast film structure on GaAs, include aluminum nitride and aluminum oxide. Many glasses have lower velocities than GaAs and are good candidates for the slow film approach.

Figure 7:
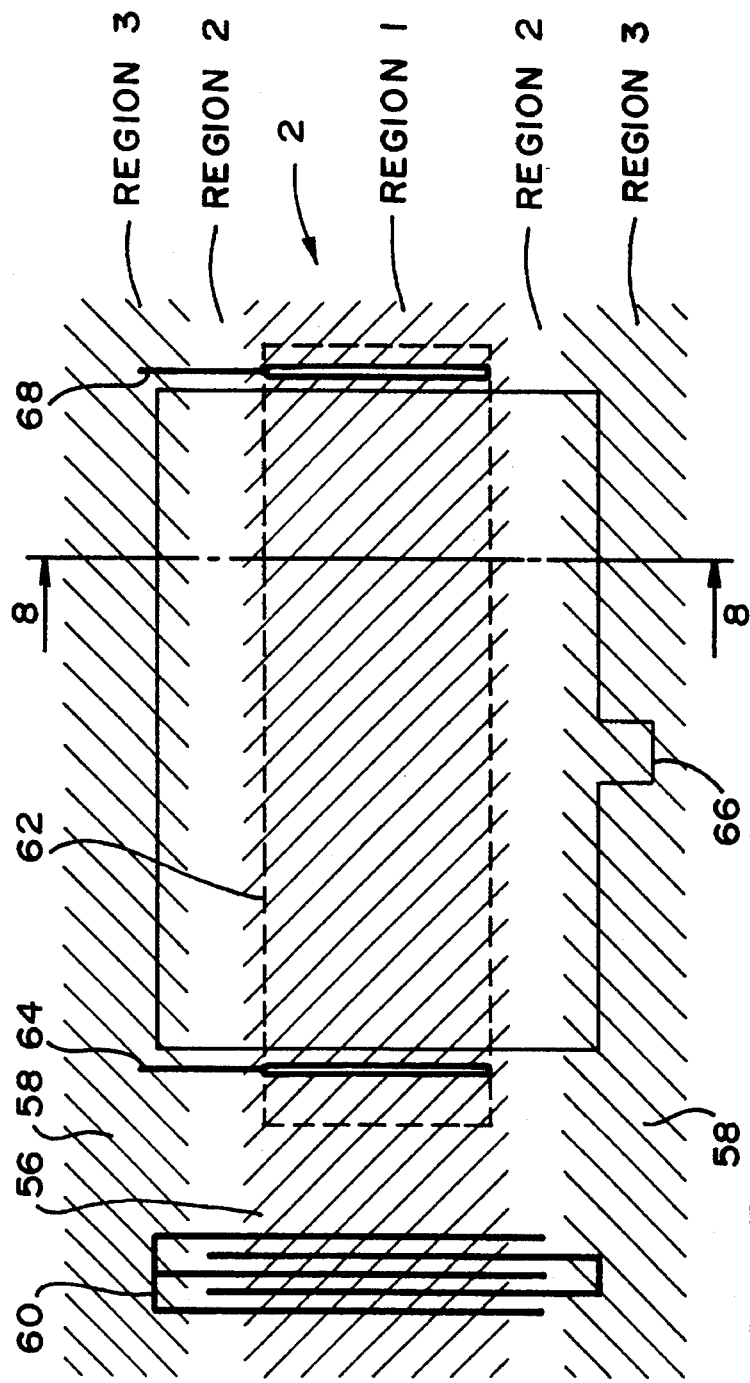
FIG. 7 is a schematic plan view of an ACT device incorporating the waveguide in FIG. 1 to control the SAW generation and propagation in the ACT device.

The application of the 3VWG typically used to control the SAW generation and propagation in an ACT device 59 is disclosed in FIG. 7. Although the figure depicts the use of the fast film structure waveguide 2 with a very simple ACT delay line for the sake of clarity, the methods illustrated herein can also be applied to the incorporation of the waveguide in more complex ACT devices and ACT integrated circuits. Hunsinger, U.S. Pat. No. 4,633,285, and other publications describe the ACT device in more detail.

Figure 8:
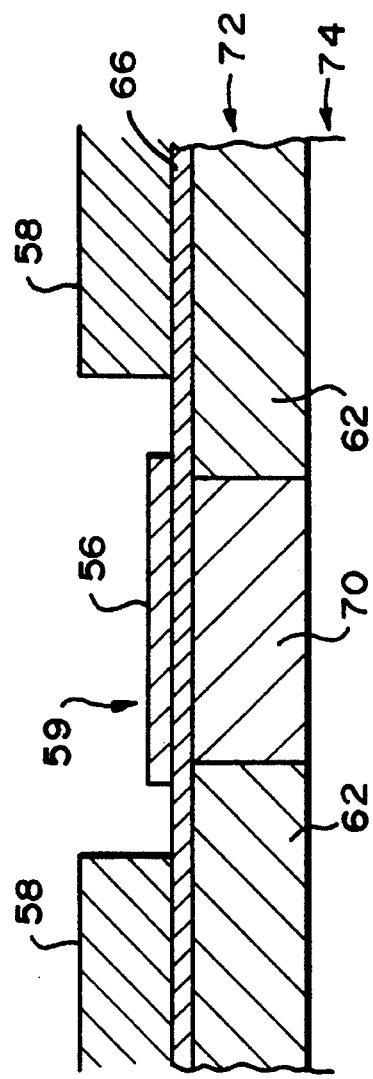
FIG. 8 is a schematic cross-sectional view taken along line 8—8 in FIG. 7.

The ACT device 59 is constructed on a GaAs epitaxial layer 72, as best shown in cross-section in FIG. 8. An ACT channel 70 is typically defined and isolated by proton bombardment of the region of the epitaxial layer 72 not enclosed by the channel boundary 62. The ACT channel surface structure features are constructed directly on the epitaxial channel layer 72 and consist of input ohmic contact 64 (see FIG. 7), Schottky barrier metal channel plate 66 (see FIG. 7), and output ohmic contact 68 (see FIG. 7). The SAW which powers the charge transport process in the device is launched by interdigital transducer 60 (see FIG. 7) which is typically constructed from the same metallization as the channel plate 66. The waveguide is typically constructed over the ACT channel structure features and SAW transducer. The waveguide consists of the region 1 defined by the inner dielectric film 56, the region 3 defined by the outer dielectric films 58, and the region 2 defined by the intermediate regions between the films 56 and 58, as best shown in FIGS. 7 and 8.

A cross-sectional view of the waveguide and the channel 70 at the plane defined by the line 8—8 in FIG. 7 is shown in FIG. 8. The semiconductor structure of the ACT device 59 typically consists of an n-type GaAs epitaxial layer 72 grown on a semi-insulating GaAs substrate 74. The ACT buried channel 70 is laterally defined and isolated by the proton isolation regions 62. The Schottky barrier metallization layer 66 underlies the region 1 waveguide dielectric film 56 and the region 3 waveguide dielectric films 58. The width of the ACT channel is typically constrained to coincide with, or be slightly subtended by, the width of the region 1 waveguide dielectric 56 where the SAW beam profile exhibits uniform amplitude.

It is desirable that the waveguide define the entire SAW propagation path through the transducer 60, as well as the propagation path through the ACT channel 70, as best shown in FIG. 7. A transducer design providing a SAW excitation strength which is weighted across the beam width according to the transverse amplitude profile of the fundamental waveguide mode is also beneficial. Methods for creating transducers with an excitation strength which varies across the beam width in a predictable way are well known in the art. The use of a waveguided transducer with excitation matched to the fundamental mode of the waveguide produces optimal generation efficiency and helps insure that the beam profile of the generated SAW is single moded with the desired beam shape.

Typical parameters for a silicon nitride dielectric embodiment of the fast film structure waveguide 2, designed specifically for a SAW with 8.1 µm wavelength and 360 MHz frequency in a GaAs ACT device, are $h_3$=6269 angstroms (0.077 wavelengths), $h_1$=269 angstroms (0.0033 wavelengths) and $W_2$=24.8 µm (3.06 wavelengths). The width $W_1$ of the central region 1 is arbitrary and can be tailored to the specific ACT channel width to be illuminated by the SAW. This waveguide provides a transition width, defined as the distance between the edge of the central region 1 and the point in region 3 at which the SAW amplitude decays to 5% of its region 1 amplitude, of approximately 31 µm (3.8 wavelengths). In general, the scaling properties of the waveguide are such that a specific waveguide design can be applied to other SAW wavelengths by scaling all dielectric thickness dimensions and the region 2 width $W_2$ by the SAW wavelength. Hence, a given waveguide design is completely specified for arbitrary SAW wavelength by the wavelength normalized dimensions given in brackets above. The waveguide parameters given are based on experimental velocity shift measurements of our PECVD silicon nitride films which indicate that the SAW velocity shift induced by the silicon nitride film on [100] cut, {110} propagating GaAs is approximately 72.5% per wavelength of film thickness.

A second and somewhat different application for the 3VWG is in more traditional SAW devices. An apodized SAW transducer contains electrodes which are length weighted to produce a filter. Implicit in the design of an apodized transducer is that the amplitude of the SAW is constant across the beam width so that the strength of the signal sensed by an electrode is proportional to the length of the sensing electrode. In practice, however, the electrode strength will be distorted by amplitude nonuniformities across the beam. An unguided SAW will experience diffraction so its beam profile will be continually changing along the propagation path. The Wilkus reference patent recognizes this and uses the waveguiding effect of the electrode structure (which is a 3VWG but not one creating a uniform beam profile) to suppress the effects of diffraction and modifies the transducer electrode geometry to compensate for the SAW amplitude nonuniformity associated with the guided mode. (When the SAW is unguided the effect of diffraction is that the beam profile is evolving continuously along the propagation path. The waveguiding in Wilkus' structure constrains the beam profile to a particular shape which is not flat but at least is not continually changing. He then designs his electrode structure to compensate for this controlled but nonuniform beam profile.) The 3VWG which is the subject of this disclosure can be used to address the issue by creating a flat beam profile. In this case, the strength of the electrodes will be simply proportional to the length of the electrodes and not distorted by a nonuniform beam. This makes the weighting of SAW filters more accurate and removes the very difficult distortion problem introduced by diffraction.

It has been mentioned that the lowest order waveguide mode is the only one that can be designed to have the desired flat beam profile. If the beam width ($W_1+2W_2$) is several wavelengths wide, which is usually the case, then the 3VWG structure will support not only the desired lowest order mode but also undesirable higher order modes as well. There are two ways to insure that this will not be a problem. First, the transducer that initially launches the SAW must only launch the lowest order wave, and secondly, there should not be any means within the waveguide to cause mode conversion into higher order modes. The former condition requires that the forcing function of the transducer should have the same profile as the desired mode, i.e., the transducer electrodes should be uniform across region 1 and should be weighted to approximate the transverse decay of the beam profile as shown in regions 2 and 3 of FIG. 6. The latter condition requires that there not be anything in the propagation path to selectively attenuate one portion of the SAW beam or perturb the velocity of one portion of the SAW beam so as to force a change in the beam profile from that shown in FIG. 6.

It is possible to deposit a uniform film of dielectric over the entire waveguide structure without changing the properties of the 3VWG. This is sometimes desirable in order to provide passivation or protection to the substrate or metal electrodes. Likewise, the waveguide structure can be constructed on top of a uniform dielectric film without affecting its operation. This flexibility can be beneficial for incorporating the waveguide construction into a complex ACT integrated circuit fabrication process which may require dielectric films other than those associated with the waveguide. Metallic electrodes may be deposited over the structure without altering the performance of the 3VWG as long as the relative values of the three velocities as shown in FIGS. 3 and 4 are not changed, i.e., the velocities may be shifted up or down together as long as the ratios between the velocities does not change.

The key advantages of the present invention relative to prior art waveguides are the high degree of amplitude uniformity across the guided SAW beam and the dielectric film construction of the waveguide which provides electrical compatibility with devices, such as the ACT device, requiring extensive metallic interconnections to features illuminated by the SAW beam. It is essential in ACT devices that the features of the electronic circuitry do not perturb the SAW beam and vice versa that the SAW beam does not damage or perturb the operation of the electronic circuitry. The ability of the compact waveguide structure to constrain the shape of the SAW beam to a flat amplitude profile, which can normally only be obtained with unguided wave propagation, provides the capability to realize dense, multiple parallel channel ACT configurations with very small channel width and channel to channel spacing. The sharp transition width capability permits integrated circuit elements, which are not compatible with SAW propagation, to be closely spaced adjacent to an ACT channel. In the fast film implementation, a silicon nitride dielectric layer construction provides superior SAW propagation loss characteristics and resistance to structural degradation in the presence of the high acoustic stresses associated with typical SAW power densities in an ACT device. This three velocity waveguide provides significant improvements in acoustic energy confinement, amplitude uniformity, propagation loss, acoustic stress resistance, and integrated circuit conductor routing flexibility compared to conventional two velocity SAW waveguides constructed with metallic films.

While this invention has been described as having preferred design, it is understood that it is capable of further modification, uses and/or adaptations of the invention following in general the principle of the invention and including such departures from the present disclosure as come within known or customary practice in the art to which the invention pertains, and as may be applied to the essential features set forth, and fall within the scope of the invention or the limits of the appended claims.

We claim:

1. A waveguide for surface acoustic waves, comprising:
a) a substrate for supporting propagation of surface acoustic waves along a direction at a substrate velocity;
b) a dielectric structure disposed above said substrate along the propagation direction of the surface acoustic waves;
c) said structure including a central portion disposed along the propagation direction, first and second intermediate portions respectively disposed along each opposed side of said central portion along the propagation direction, and first and second outer portions respectively disposed along each outer side of said first and second intermediate portions along the propagation direction;
e) said central, intermediate and outer portions each having first, second and third intrinsic surface acoustic wave propagation velocities along the propagation direction of the surface acoustic waves, respectively; and
f) said first velocity being intermediate of said second and third velocities.

2. A waveguide as in claim 1, wherein:
g) said central portion has a thickness such that said first velocity is equal to a two-velocity-waveguide lowest order mode velocity, whereby the acoustic surface waves have an amplitude profile transverse to the propagation direction that is substantially constant over said central portion.

3. A waveguide as in claim 1, wherein:
a) said structure comprises silicon nitride.

4. A waveguide as in claim 1, wherein:
a) said structure comprises aluminum nitride.

5. A waveguide as in claim 1, wherein:
a) said structure comprises aluminum oxide.

6. A waveguide as in claim 1, wherein:
a) said substrate comprises gallium arsenide.

7. A waveguide as in claim 1, wherein:
a) said central portion comprises a first layer having a first thickness;
b) said first and second outer portions each comprises a second layer having a second thickness; and
c) said first and second intermediate portions each comprises a slot defined between respective edge portions of said central and first and second outer portions and by respective underlying portions of said substrate.

8. A waveguide as in claim 7, wherein:
a) said first thickness is smaller than said second thickness.

9. A waveguide as in claim 7, wherein:
a) said second velocity is equal to said substrate velocity.

10. A waveguide as in claim 1, wherein:
a) said central portion comprises a first layer having a first thickness;
b) said first and second intermediate portions each comprises a second layer having a second thickness; and
c) said first and second outer portions each comprises respective underlying portions of said substrate.

11. A waveguide as in claim 10, wherein:
a) said first thickness is smaller than said second thickness.

12. A waveguide as in claim 10, wherein:
a) said third velocity is equal to said substrate velocity.

13. A surface acoustic wave device, comprising:
a) a substrate having first and second ends, said substrate defining a propagation direction for surface acoustic waves between said first end and said second end;
b) a transducer disposed at said first end for generating and propagating the surface acoustic waves in said substrate from said first end to said second end; and
c) a waveguide operably associated with said substrate for propagating the surface acoustic waves therethrough, said waveguide having regions with first, second and third intrinsic surface acoustic wave propagation velocities along the propagation direction.

14. A surface acoustic wave a device as in claim 13, wherein:
a) said waveguide comprises a dielectric structure disposed above said substrate along the propagation direction of the surface acoustic waves;
b) said structure including a central portion disposed along the propagation direction, first and second intermediate portions respectively disposed along each opposed side of said central portion along the propagation direction, and first and second outer portions respectively disposed along each outer side of said first and second intermediate portions along the propagation direction;
c) said central, intermediate and outer portions each having said first, second and third intrinsic surface acoustic wave propagation velocities along the propagation direction of the surface acoustic waves, respectively; and
d) said first velocity being intermediate of said second and third velocities.

15. A surface acoustic wave device as in claim 14, wherein:
a) said central portion has a thickness such that said first velocity is equal to a two-velocity-waveguide lowest order mode velocity, whereby the acoustic surface waves have an amplitude profile transverse to the propagation direction that is substantially constant over said central portion.

16. A surface acoustic wave device as in claim 14, wherein:
a) said central portion comprises a first layer having a first thickness;
b) said first and second outer portions each comprises a second layer having a second thickness; and
c) said first and second intermediate portions each comprises a slot defined between respective edge portions of said central and first and second outer portions and by respective underlying portions of said substrate.

17. A surface acoustic wave device as in claim 16, wherein:
a) said first thickness is smaller than said second thickness.

18. A surface acoustic wave device as in claim 16, wherein:
a) said second velocity is equal to said substrate velocity.

19. A surface acoustic wave device as in claim 14, wherein:
a) said central portion comprises a first layer having first thickness;
b) said first and second intermediate portions each comprises a second layer having a second thickness; and
c) said first and second outer portions each comprises respective underlying portions of said substrate.

20. A surface acoustic wave device as in claim 19, wherein:
a) said first thickness is smaller than said second thickness.

21. A surface acoustic wave device as in claim 19, wherein:
a) said third velocity is equal to said substrate velocity.

22. An acoustic charge transport device, comprising:
a) a substrate;
b) a channel disposed within said substrate for defining a propagation direction for a surface acoustic wave, said channel having first and second ends;
c) a transducer operatively associated with said first end for generating and propagating the surface acoustic wave through said channel from said first end to said second end; and
d) a waveguide operably associated with said substrate for propagating the surface acoustic waves therethrough, said waveguide having regions with first, second and third intrinsic surface acoustic wave propagation velocities along the propagation direction.

23. An acoustic charge transport device as in claim 22, wherein:
a) said waveguide comprises a dielectric structure disposed above said substrate along the propagation direction of the surface acoustic waves;
b) said structure including a central portion disposed along the propagation direction, first and second intermediate portions respectively disposed along each opposed side of said central portion along the propagation direction, and first and second outer portions respectively disposed along each outer side of said first and second intermediate portions along the propagation direction;
c) said central, intermediate and outer portions each having first, second and third intrinsic surface acoustic wave propagation velocities along the propagation direction of the surface acoustic waves, respectively; and
d) said first velocity being intermediate of said second and third velocities.

24. An acoustic charge transport device as in claim 23, wherein:
a) said central portion has a thickness such that said first velocity is equal to a two-velocity-waveguide lowest order mode velocity, whereby the acoustic surface waves have an amplitude profile transverse to the propagation direction that is substantially constant over said central portion.

25. An acoustic charge transport device as in claim 23, wherein:
   a) said central portion comprises a first layer having a first thickness;
   b) said first and second outer portions each comprises a second layer having a second thickness; and
   c) said first and second intermediate portions each comprises a slot defined between respective edge portions of said central and first and second outer portions and by respective underlying portions of said substrate.

26. An acoustic charge transport device as in claim 25, wherein:
   a) said first thickness is smaller than said second thickness.

27. An acoustic charge transport device as in claim 25, wherein:
   a) said second velocity is equal to said substrate velocity.

28. An acoustic charge transport device as in claim 23, wherein:
   a) said central portion comprises a first layer having first thickness;
   b) said first and second intermediate portions each comprises a second layer having a second thickness; and
   c) said first and second outer portions each comprises respective underlying portions of said substrate.

29. An acoustic charge transport device as in claim 28, wherein:
   a) said first thickness is smaller than said second thickness.

30. An acoustic charge transport device as in claim 28, wherein:
   a) said third velocity is equal to said substrate velocity.

31. A method for integrating a three velocity waveguide on a substrate for surface acoustic waves in a propagation direction, said method comprising the steps of:
   a) providing a substrate with a surface;
   b) providing a first dielectric layer on the substrate surface;
   c) etching a portion of the first layer to the substrate surface along the propagation direction of the surface acoustic waves, whereby a channel is formed having first and second opposed side walls;
   d) providing a second dielectric layer on the first layer and on the exposed portion of the substrate surface;
   e) etching down to the substrate surface the first and second opposed side walls and a respective adjacent portion of the second layer disposed on the substrate surface along the propagation direction of the acoustic surface waves such that a pair of parallel grooves are formed;
   f) whereby said waveguide is formed having a central portion with first intrinsic velocity disposed along the propagation direction, first and second intermediate grooves each with second intrinsic velocity respectively disposed along each opposed side of the central portion along the propagation direction, and first and second outer portions each with third intrinsic velocity respectively disposed along each outer side of the first and second grooves along the propagation direction.

* * * * *